United States Patent

Oda

[11] Patent Number: 5,985,750
[45] Date of Patent: Nov. 16, 1999

[54] MANUFACTURING METHOD OF SEMICONDUCTOR DEVICE

[75] Inventor: Noriaki Oda, Tokyo, Japan

[73] Assignee: NEC Corporation, Tokyo, Japan

[21] Appl. No.: 09/080,049

[22] Filed: May 15, 1998

[30] Foreign Application Priority Data

May 23, 1997 [JP] Japan ................................. 9-150408

[51] Int. Cl.$^6$ .................................................. H01L 21/44
[52] U.S. Cl. ........................................... 438/623; 257/759
[58] Field of Search ............................ 257/759; 438/673

[56] References Cited

U.S. PATENT DOCUMENTS

| | | | |
|---|---|---|---|
| 4,843,034 | 6/1989 | Hernadon et al. | 437/189 |
| 5,103,288 | 4/1992 | Sakamoto et al. | 357/71 |
| 5,282,922 | 2/1994 | Reche | 156/643 |
| 5,804,259 | 9/1998 | Robles | 427/577 |

FOREIGN PATENT DOCUMENTS

| | | | |
|---|---|---|---|
| 60-46036 | 3/1985 | Japan | H01L 21/316 |
| 63-287036 | 11/1988 | Japan | H01L 21/90 |
| 64-89341 | 4/1989 | Japan | H01L 21/88 |
| 2278731 | 11/1990 | Japan | H01L 21/302 |
| 574960 | 3/1993 | Japan | H01L 21/90 |
| 883842 | 3/1996 | Japan | H01L 21/768 |

*Primary Examiner*—Olik Chaudhuri
*Assistant Examiner*—Douglas A. Wille
*Attorney, Agent, or Firm*—Hayes Soloway Hennessey Groosman & Hage PC

[57] ABSTRACT

A manufacturing method is provided to manufacture a semiconductor device, which contains an interlayer insulating film corresponding to an oxide film or a film made of BPSG formed on a semiconductor substrate. Herein, selective etching is performed using etching gas with respect to an aluminum wiring layer, which is formed on the interlayer insulating film. Then, a surface of the interlayer insulating film, which is exposed by the selective etching, is subjected to reforming. Thereafter, a layer of fluoride amorphous carbon is formed in accordance with a CVD method or else. According to one method for the reforming, after the selective etching of the aluminum wiring layer, the etching gas is changed with gas containing $CF_4$ so that plasma process is performed on the surface of the interlayer insulating film. According to another method for the reforming, before formation of the fluoride amorphous carbon, ion implantation of silicon is performed on the surface of the interlayer insulating film. Because of the reforming, it is possible to maintain adherence between the fluoride amorphous carbon and interlayer insulating film.

15 Claims, 9 Drawing Sheets

MANUFACTURING METHOD OF SEMICONDUCTOR DEVICE

BACKGROUND OF THE INVENTION

1. Field of the Invention

This invention relates to manufacturing methods for manufacturing semiconductor devices which use films containing amorphous fluorine carbide as interlayer insulating films for wiring. This application is based on patent application No. Hei 9-150408 filed in Japan, the content of which is incorporated herein by reference.

2. Prior Art

Recently, the downsizing and high-speed performance are demanded for semiconductor devices, while a degree of integration is improved. So, components whose sizes are determined to be less than 0.25 $\mu$m in accordance with the prescribed design rule (hereinafter, simply referred to as 0.25 $\mu$m design rule) are formed on a silicon substrate.

To achieve the downsizing and high-speed performance of the semiconductor devices, it is important to employ the multi-layer structure for the wiring connecting the components in addition to the fine structure in measurements of the components independently. To achieve the multi-layer structure of the wiring, it is necessary to provide separation, using an insulating film, between wires.

As the components are subjected to fine structure in measurements, the measurements of the wires and intervals of distance between the wires are subjected to fine structure in order to achieve the downsizing of the semiconductor devices. For example, in the case of the 0.35 $\mu$m design rule which provides the most fine structure for the present manufactures, the wiring pitch is approximately 1.5 $\mu$m. In the case of the "next generation" 0.25 $\mu$m design rule, the wiring pitch ranges between 0.8 $\mu$m and 1.0 $\mu$m, while in the case of the 0.18 $\mu$m design rule, the required wiring pitch ranges approximately between 0.4 $\mu$m and 0.6 $\mu$m.

As the measurements of the wires and the intervals of distances between the wires become small, the wiring capacity becomes great. So, there is a problem (or drawback) that the operating speed and power consumption of the circuits become large. To cope with such a problem, as the interlayer material for wiring, it is necessary to use the material whose dielectric constant (or permittivity) is low as compared with the conventional material corresponding to the oxide film.

As a candidate for such a low permittivity film, it is possible to provide an insulating film composed of carbon and fluorine (hereinafter, referred to as "fluoride amorphous carbon"). For example, the paper of Japanese Patent Laid-Open Publication No. 5-74960 (denoted by "paper 1") discloses an example of the conventional manufacturing method for manufacturing a semiconductor device using the above insulating film having a low dielectric constant, which is about 2.5.

Next, a description will be given with respect to the above conventional manufacturing method of the semiconductor device (hereinafter, simply referred to as "conventional example 1") with reference to FIG. 4A, FIG. 4B and FIG. 4C.

Figure 4A:
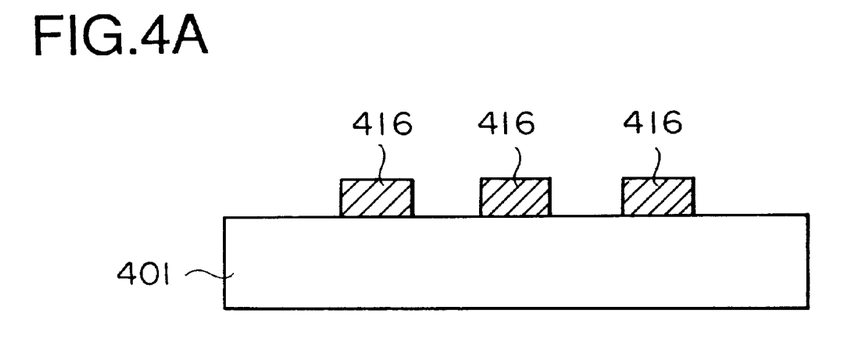
FIG. 4A, FIG. 4B and FIG. 4C are process sectional views showing cross sections of a semiconductor device which is manufactured in accordance with a manufacturing method according to conventional example 1.
Figure 4B:
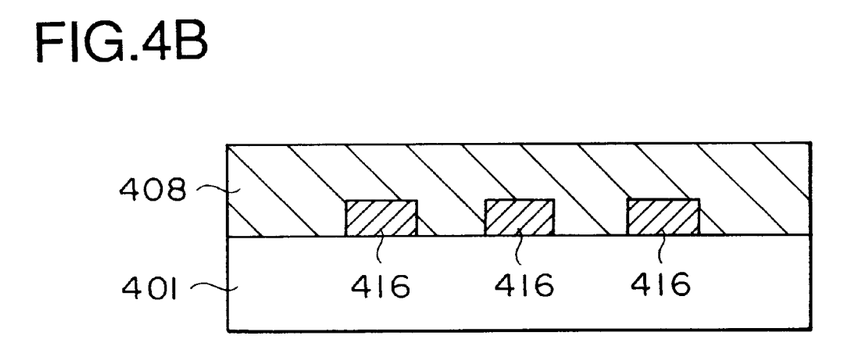
Figure 4C:
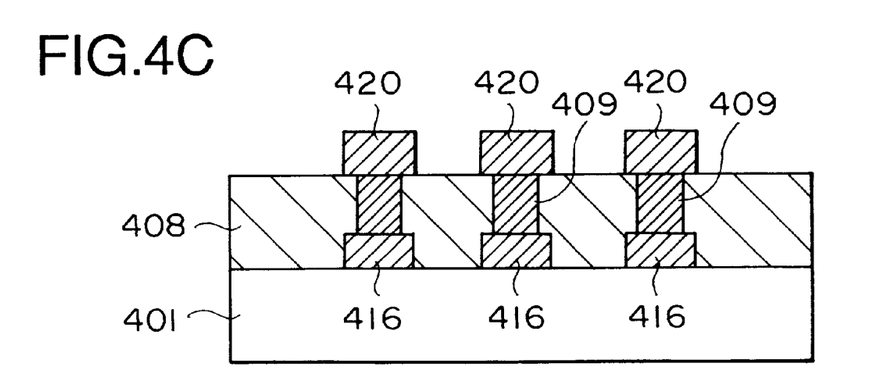

FIG. 4A, FIG. 4B and FIG. 4C are process sectional views showing a sequence of manufacturing processes for the conventional example 1.

First, as shown in FIG. 4A, a first wiring layer 416 having a film thickness of 1 $\mu$m and composed of aluminum is formed on a silicon substrate 401.

Next, as shown in FIG. 4B, the conventional example 1 effects plasma polymerization that uses $C_2F_4$ as source gas so as to deposit the material of fluoride amorphous carbon 408 to form a layer having thickness of about 1 $\mu$m. The above plasma polymerization is effected under conditions that an amount of flow is set at 250 sccm, pressure at 0.1 Torr, electric power at 300 W and time of application at 10 minutes.

Then, as shown in FIG. 4C, the conventional example 1 effects the photolithography method to form VIA holes 409 in the layer of the fluoride amorphous carbon 408 while using the aluminum to form a second wiring layer 420, which is subjected to patterning. Under the aforementioned conditions, the fluoride amorphous carbon 408 is formed to have a dielectric constant of 2.4.

However, when forming the layer of the fluoride amorphous carbon on the oxide film in accordance with the conventional manufacturing method of the semiconductor device described above, there is a problem that adherence is not so good, so the layer is easily peeled off. The aforementioned paper 1 does not provide description regarding solution of the above problem. This paper 1 merely describes an example that fluoride amorphous carbon is formed on the silicon substrate.

This invention is provided to achieve an object in improvements of the adherence of the fluoride amorphous carbon formed on the oxide film, which will be described later. In other words, this invention proposes a new manufacturing method of the semiconductor device to achieve the above object by reforming the surface of the oxide film, which is a lower layer, when effecting Al etching.

Next, a description will be given with respect to conventional examples that are designed to achieve reforming of the surface of the oxide film.

First, the paper of Japanese Patent Laid-Open Publication No. 2-278731 (denoted by "paper 2") discloses an example of the conventional manufacturing method of the semiconductor device (hereinafter, referred to as "conventional example 2"), which provides a method containing a sequence of steps as follows:

Dry etching is effected to perform patterning of an Al film so that Al wires are formed. After the patterning, a surface of the Al film is subjected to cleaning using the dry etching method or wet etching method. Thus, it is possible to avoid an increase of contact resistance at VIA holes due to existence of residual gas ions on the surface of the Al film.

The content of the aforementioned conventional example 2 will be described with reference to FIG. 5A to FIG. 5E, which are process sectional views.

Figure 5:
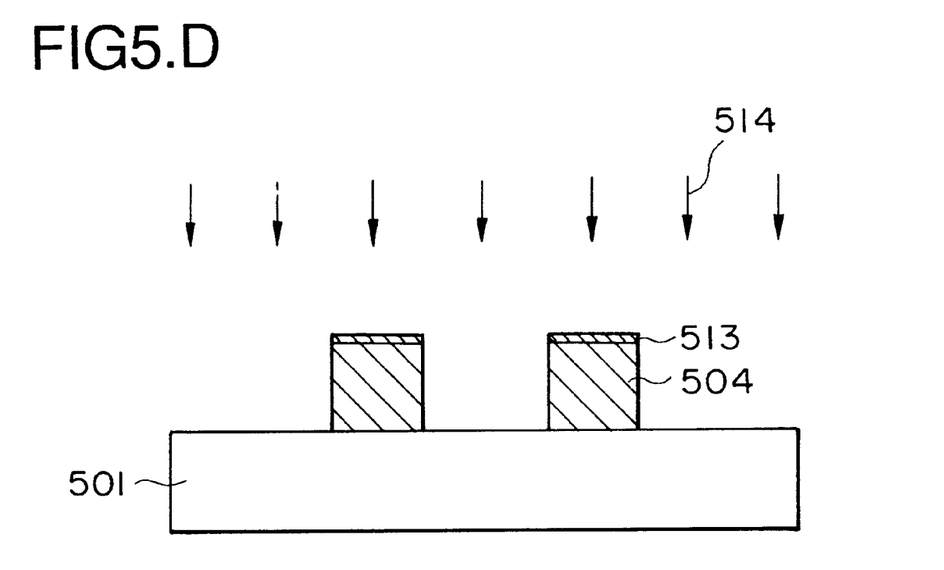
FIG. 5A, FIG. 5B, FIG. 5C, FIG. 5D and FIG. 5E are process sectional views showing cross sections of a semiconductor device which is manufactured in accordance with a manufacturing method according to conventional example 2.
Figure 5A:
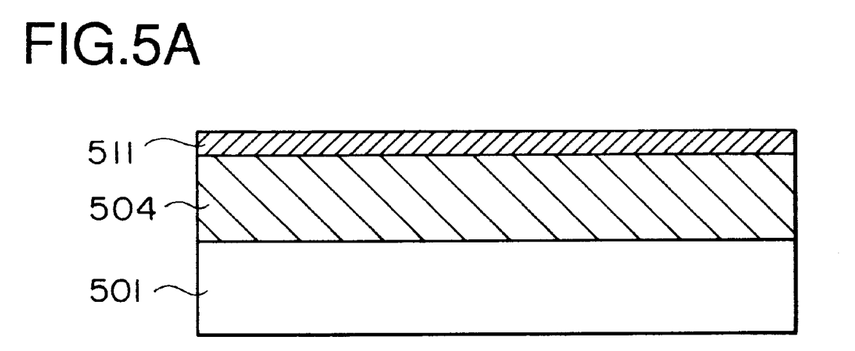

As shown in FIG. 5A, aluminum 504 (which corresponds to a first wiring layer) and a silicon film 511 (which is provided for anti-reflection) are sequentially formed on a semiconductor substrate 501.

Figure 5B:
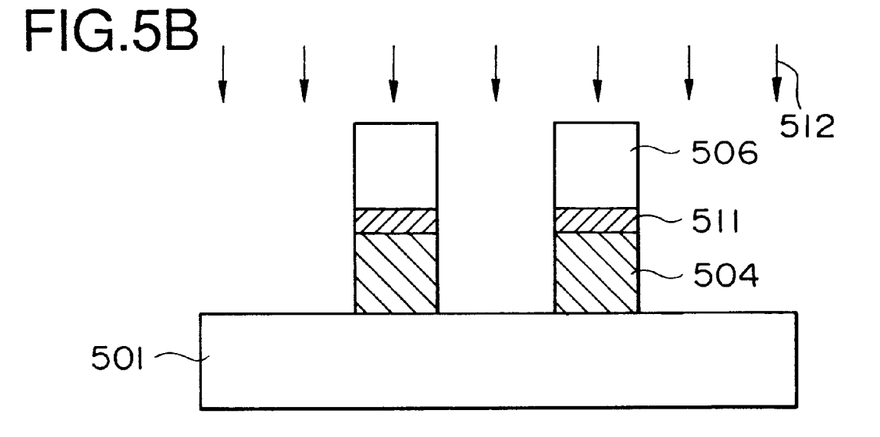

Next, as shown in FIG. 5B, the semiconductor device of FIG. 5A is painted by photoresist 506 and is subjected to selective exposure to light using a mask. Using etching gas for Al, the silicon film 511 and aluminum portions 504 are subjected to selective etching.

Figure 5C:
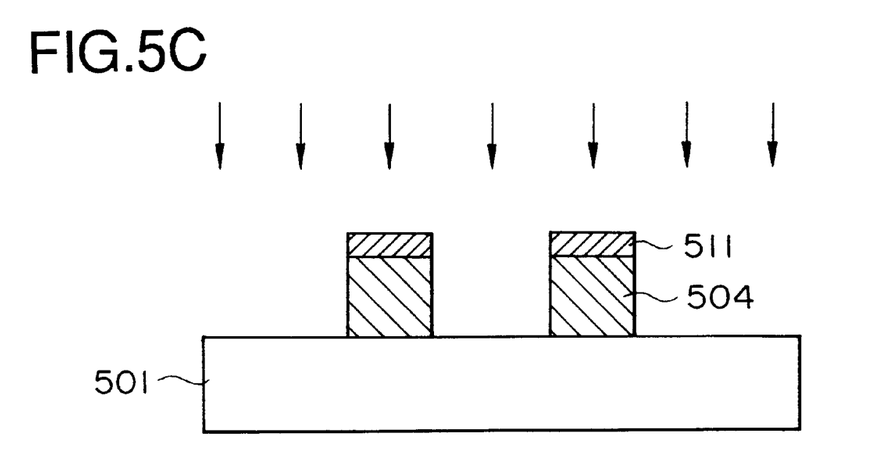

Then, the photoresist 506 is peeled off as shown in FIG. 5C. Thereafter, etching is effected using etching gas for silicon film to remove the silicon film 511.

As shown in FIG. 5D, residual gas ions 513 remain on the aluminum 504. So, the plasma etching method using inert gas 514 such as Ar is effected to remove the residual gas ions 513.

Figure 5E:
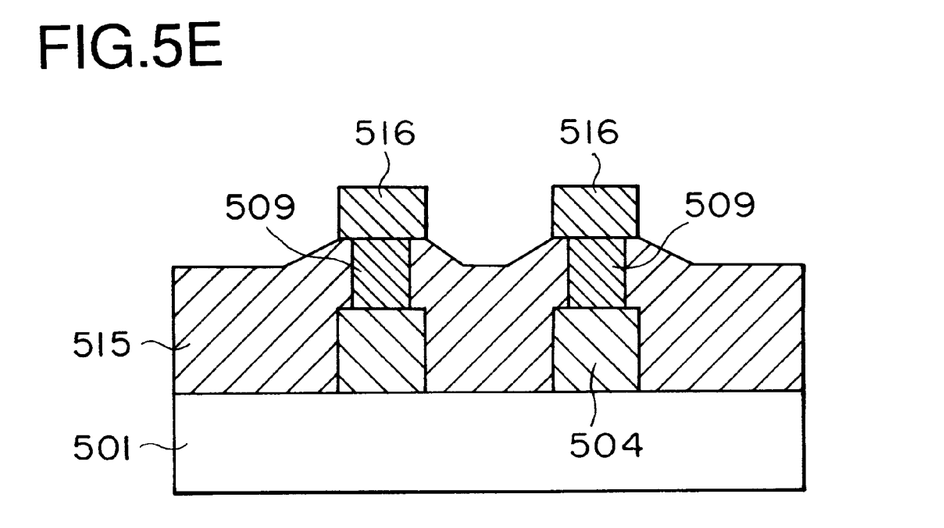

Next, as shown in FIG. 5E, the plasma CVD method (where "CVD" is an abbreviation for "Chemical Vapor Deposition") is effected to form a SiNx film 515. In addition, VIA holes 509 are formed in the SiNx film 515. Thereafter, a second wiring layer 516 is formed using aluminum on the SiNx film 515 in contact with the VIA holes 509.

Next, a description will be given with respect to another example of the manufacturing method of the semiconductor device (hereinafter, referred to as "conventional example 3"), which is disclosed by the paper of Japanese Patent Laid-Open Publication No 63-287036 (denoted by "paper 3"). The content of the conventional example 3 will be described with reference to FIG. 6A to FIG. 6D, which are process sectional views.

Figure 6A:
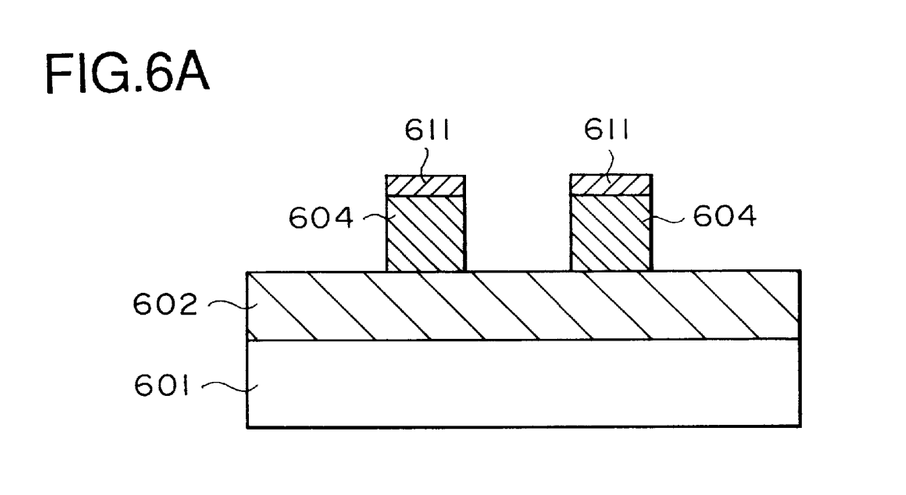
FIG. 6A, FIG. 6B, FIG. 6C and FIG. 6D are process sectional views showing cross sections of a semiconductor device which is manufactured in accordance with a manufacturing method according to conventional example 3.

As shown in FIG. 6A, a first interlayer insulating film 602, aluminum 604 (corresponding to a first wiring layer) and an anti-reflection silicon film 611 are sequentially formed on a semiconductor substrate 601. Using the photolithography process and reactive ion etching, the silicon film 611 and the aluminum 604 are subjected to selective etching.

Figure 6B:
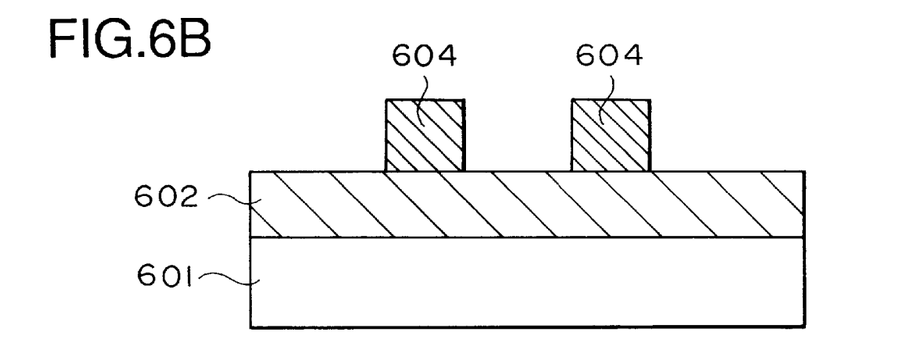
Figure 6C:
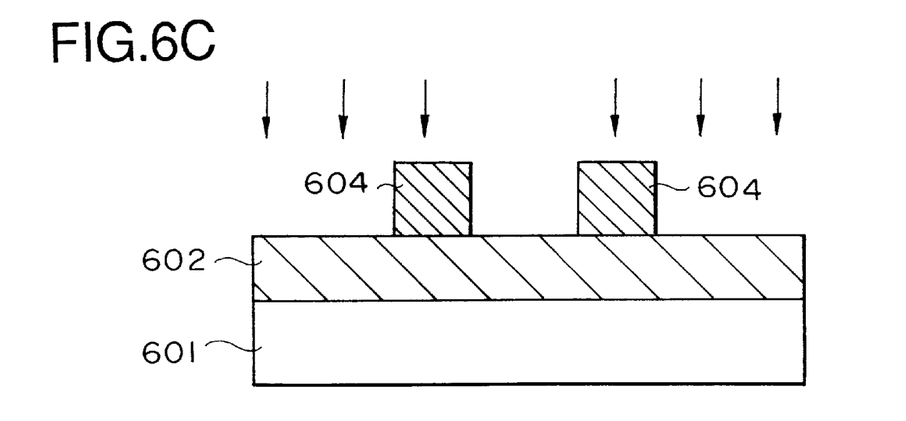

Then, as shown in FIG. 6B, the silicon film 611 is removed by etching. Next, as shown in FIG. 6C, the RF sputter etching process using argon gas is effected on the aluminum 604 as well as a surface of the first interlayer insulating film 602, which is a bed (or substrate).

Figure 6D:
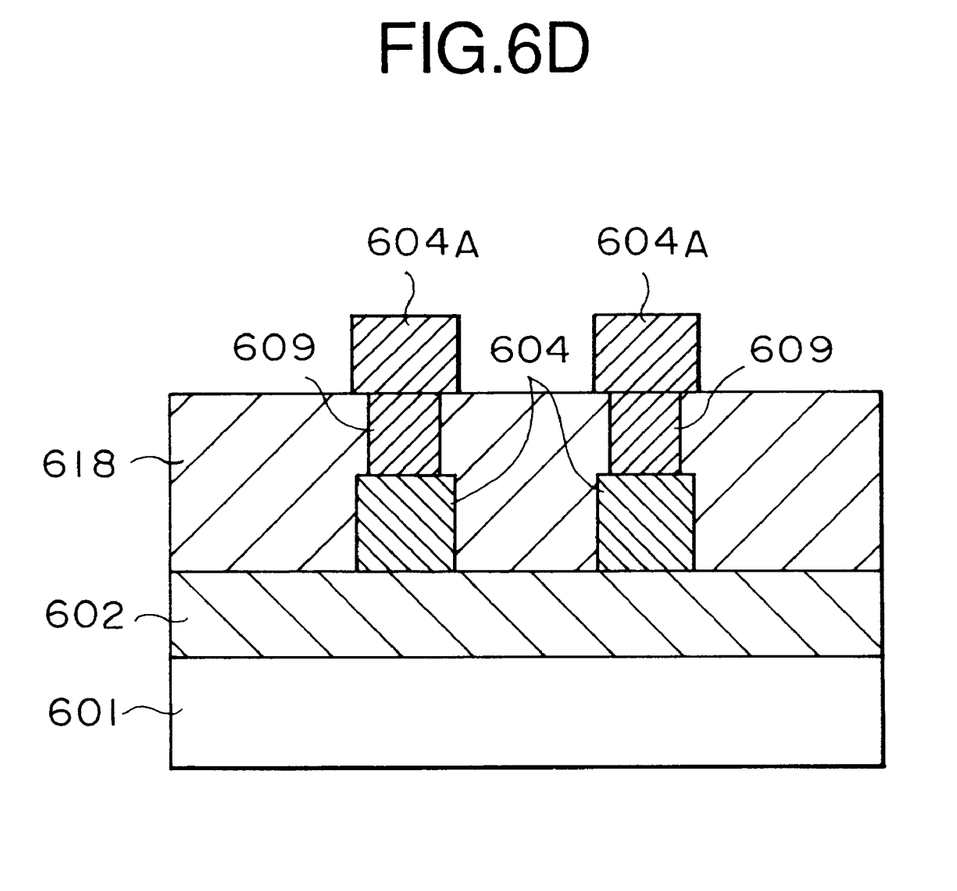

Thereafter, as shown in FIG. 6D, the conventional example 3 performs deposition of a second interlayer insulating film 618. VIA holes 609 are formed in the second interlayer insulating film 618. Then, aluminum 604A is formed as a second wiring layer on the second interlayer insulating film 618 in contact with the VIA holes 609 by using the selective etching. Incidentally, etching reactive products are adhered to a surface of an aluminum film, which is used as a bed for deposition. So, before the deposition of the second interlayer insulating film 618, the conventional example 3 removes the etching reactive products by etching. Thus, it is possible to strengthen the adherence of the interlayer insulating film formed on the aluminum film.

The conventional manufacturing methods aim at improvements of only the adherence of the interlayer insulating film formed on the aluminum wires. However, those methods are not designed in consideration of the adherence between interlayer films. In addition, the conventional manufacturing methods do not have effectiveness in formation of the fluoride amorphous carbon on the oxide film.

In the interlayer formation method using the amorphous carbon, the amorphous carbon is directly adhered to the oxide film, wherein the layer of the amorphous carbon is not formed with a good adherence and is easily peeled off, which is a problem that the conventional methods cannot solve.

SUMMARY OF THE INVENTION

It is an object of the invention to provide a manufacturing method of a semiconductor device, which is capable of improving defectiveness in adherence of fluoride amorphous carbon directly adhered onto an oxide film.

It is another object of the invention to provide a manufacturing method which is capable of manufacturing semiconductor devices with a good yield by reducing occurrence of open-circuit defective and short-circuit defective of wires.

A manufacturing method of this invention is provided to manufacture a semiconductor device, which contains an interlayer insulating film corresponding to an oxide film or a film made of BPSG formed on a semiconductor substrate.

First, selective etching is performed using etching gas with respect to an aluminum wiring layer, which is formed on the interlayer insulating film. Then, a surface of the interlayer insulating film, which is exposed by the selective etching, is subjected to reforming. Thereafter, a layer of fluoride amorphous carbon is formed in accordance with a CVD method or else.

According to one method for the reforming, after the selective etching of the aluminum wiring layer, the etching gas is changed with gas containing $CF_4$ so that plasma process is performed on the surface of the interlayer insulating film. According to another method for the reforming, before formation of the fluoride amorphous carbon, ion implantation of silicon is performed on the surface of the interlayer insulating film.

Because of the reforming, it is possible to maintain adherence between the fluoride amorphous carbon and interlayer insulating film. So, it is possible to reduce occurrence of the open-circuit defective and short-circuit defective of the wires.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

The manufacturing method of the semiconductor device described by the present embodiment of this invention is constructed mainly by processes as follows:

Aluminum wires are subjected to selective etching. Then, a surface of an oxide film which is formed beneath the aluminum wires are subjected to reforming. Thereafter, the present embodiment initiates formation of fluoride amorphous carbon.

As the method of reforming of the surface of the oxide film, there are provided two methods as follows:

First method is to perform plasma process, using gas containing $CF_4$, on the surface of the oxide film after etching of aluminum. Second method is to perform ion implantation before formation of the fluoride amorphous carbon.

According to the present embodiment of this invention, the manufacturing method of the semiconductor device is designed such that after etching of aluminum wires, reforming is performed on the surface of the oxide film, which is located beneath the aluminum wires. Thus, it is possible to maintain adherence between the oxide film and fluoride amorphous carbon. In addition, it is possible to avoid occurrence of the open-circuit defective and short-circuit defective of the wires, which occur when the wires and interlayer film, located above the fluoride amorphous carbon, are peeled off.

Next, a description will be given with respect to a manufacturing method of a semiconductor device according to an example 1 of this invention.

FIG. 1A to FIG. 1E are process sectional views diagrammatically showing cross sections of a semiconductor device in accordance with steps of the manufacturing method according to the example 1 of this invention.

Figure 1A:
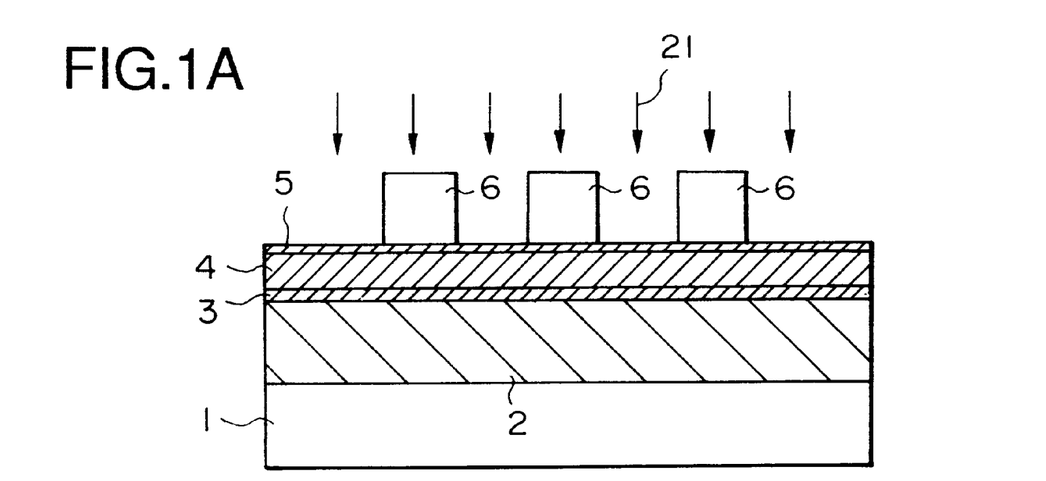
FIG. 1A, FIG. 1B, FIG. 1C, FIG. 1D and FIG. 1E are process sectional views showing cross sections of a semiconductor device which is manufactured in accordance with a manufacturing method according to example 1 of this invention.

FIG. 1A shows a cross section of a semiconductor, which is subjected to manufacturing method of the example 1 of this invention. Herein, a first interlayer insulating film 2 is formed in thickness of about 800 nm on a semiconductor substrate 1. The first interlayer insulating film 2 is made of some material such as BPSG (an abbreviation for "Boron phosphosilicate glass"). After formation of openings of contact holes (not shown), layers of first barrier metal 3, first aluminum 4 and first titanium nitride 5 are sequentially formed on the first interlayer insulating film 2 by the sputtering method and the like. Herein, the first aluminum 4 is used for a first wiring layer, while the first titanium nitride 5 is used for anti-reflection in the photolithography process, which will be effected later. Then, the layer of first titanium nitride 5 is coated with photoresist 6. Using the normal photolithography process, the photoresist 6 is subjected to patterning. Thereafter, using mixed gas of $Cl_2$ and $N_2$ (where mixing rate approximately ranges between 4:1 and 5:1), for example, the first titanium nitride 5, the first aluminum 4 and the first barrier metal 3 are subjected to selective etching under the conditions where air pressure is set at about 10 mTorr and RF power at about 100 W.

Figure 1B:
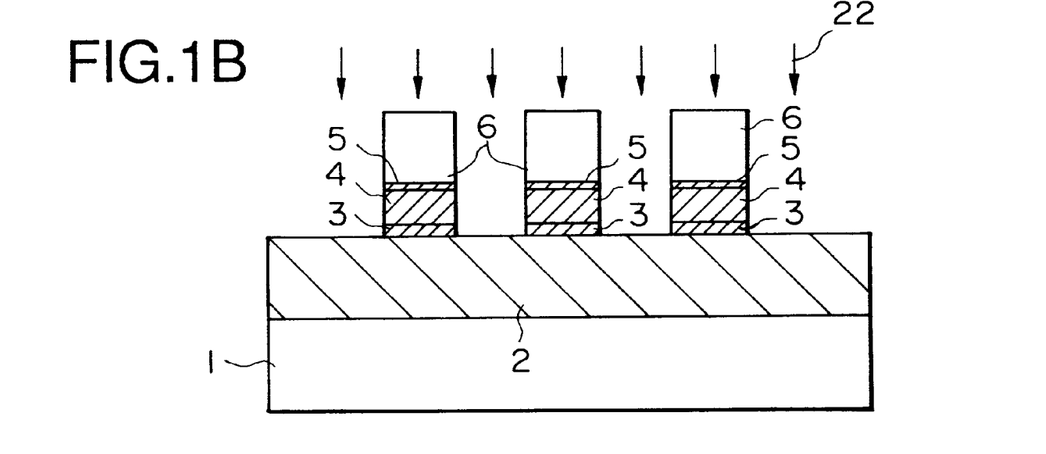
Figure 1C:
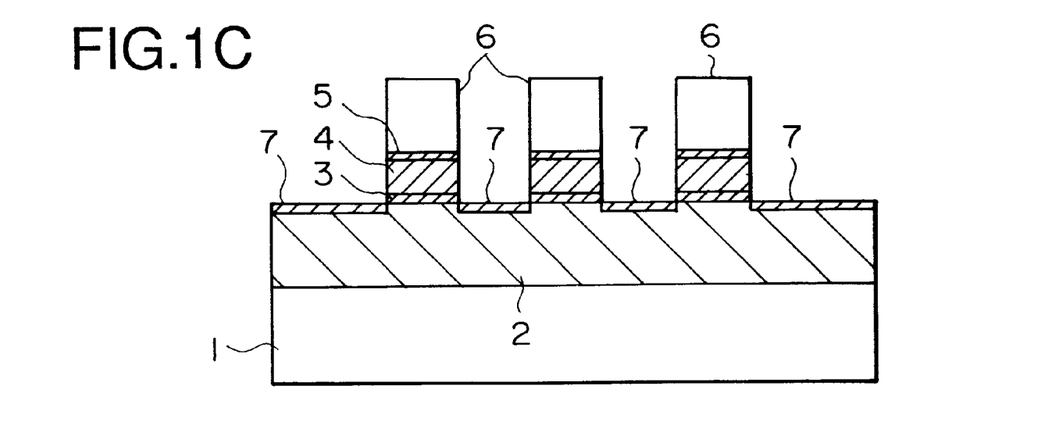

Next, the aforementioned etching gas is changed with $CF_4$ so that the semiconductor of FIG. 1A is subjected to etching to form a semiconductor of FIG. 1B. After completion of the etching of the first barrier metal 3, the first interlayer insulating film 2 is exposed. Next, as shown in FIG. 1C, a porous damage layer 7 is formed on a surface of the first interlayer insulating film 2. Herein, the plasma process is performed using $CF_4$ under the conditions where an amount of flow of $CF_4$ is set at 20 sccm, RF power at 500 W and air pressure at 20 mTorr.

Figure 1D:
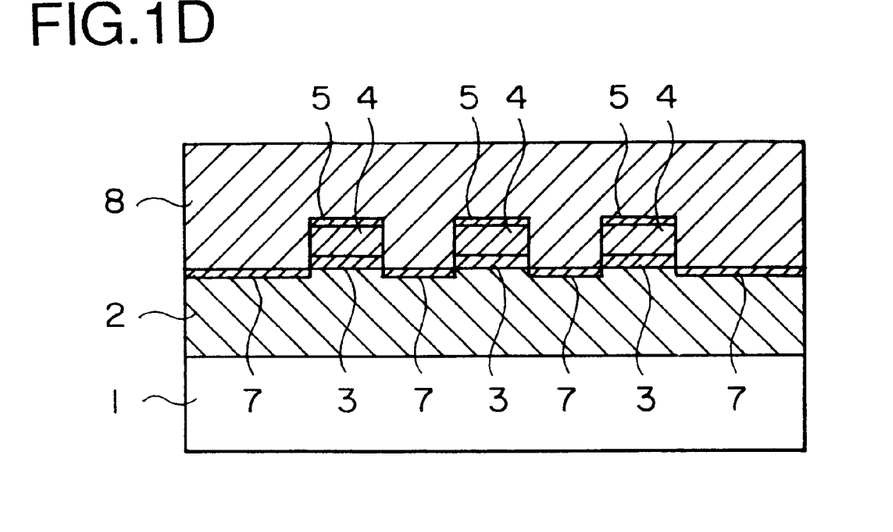

Then, as shown in FIG. 1D, the photoresist 6 is peeled off using $O_2$ plasma; thereafter, a layer of fluoride amorphous carbon 8 is formed using the plasma CVD method.

Figure 1E:
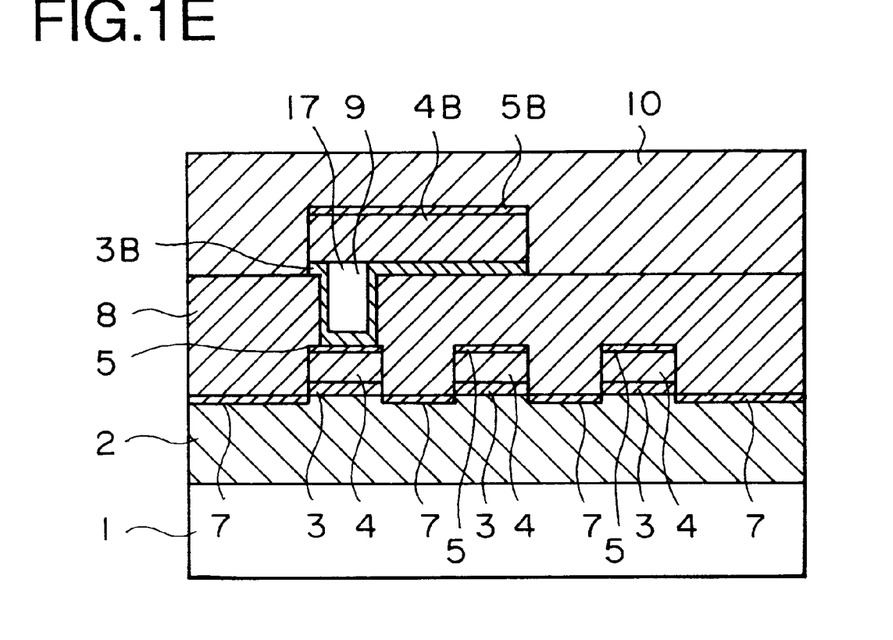

Next, a semiconductor device of FIG. 1E is manufactured in accordance with steps as follows:

VIA holes 9 are selectively opened. Then, a layer of second barrier metal 3B is formed by the sputtering method, so that interior walls of the VIA hole 9 are coated with the second barrier metal 3B. Tungsten 17 is embedded in the VIA hole 9. Layers of second aluminum 4B and second titanium nitride 5B are formed to cover an overall surface of the semiconductor by the sputtering method or else. Herein, the second aluminum 4B corresponds to a second wiring layer, while the second titanium nitride 5B is used for anti-reflection. Then, the layers of the second titanium nitride 5B, second aluminum 4B and second barrier metal 3B, which are sequentially formed on the semiconductor, are subjected to patterning using the photolithography method and reactive ion etching. Thereafter, a cover film 10 made of a silicon nitride film or else is formed to cover the aforementioned semiconductor as a whole.

Figure 2:
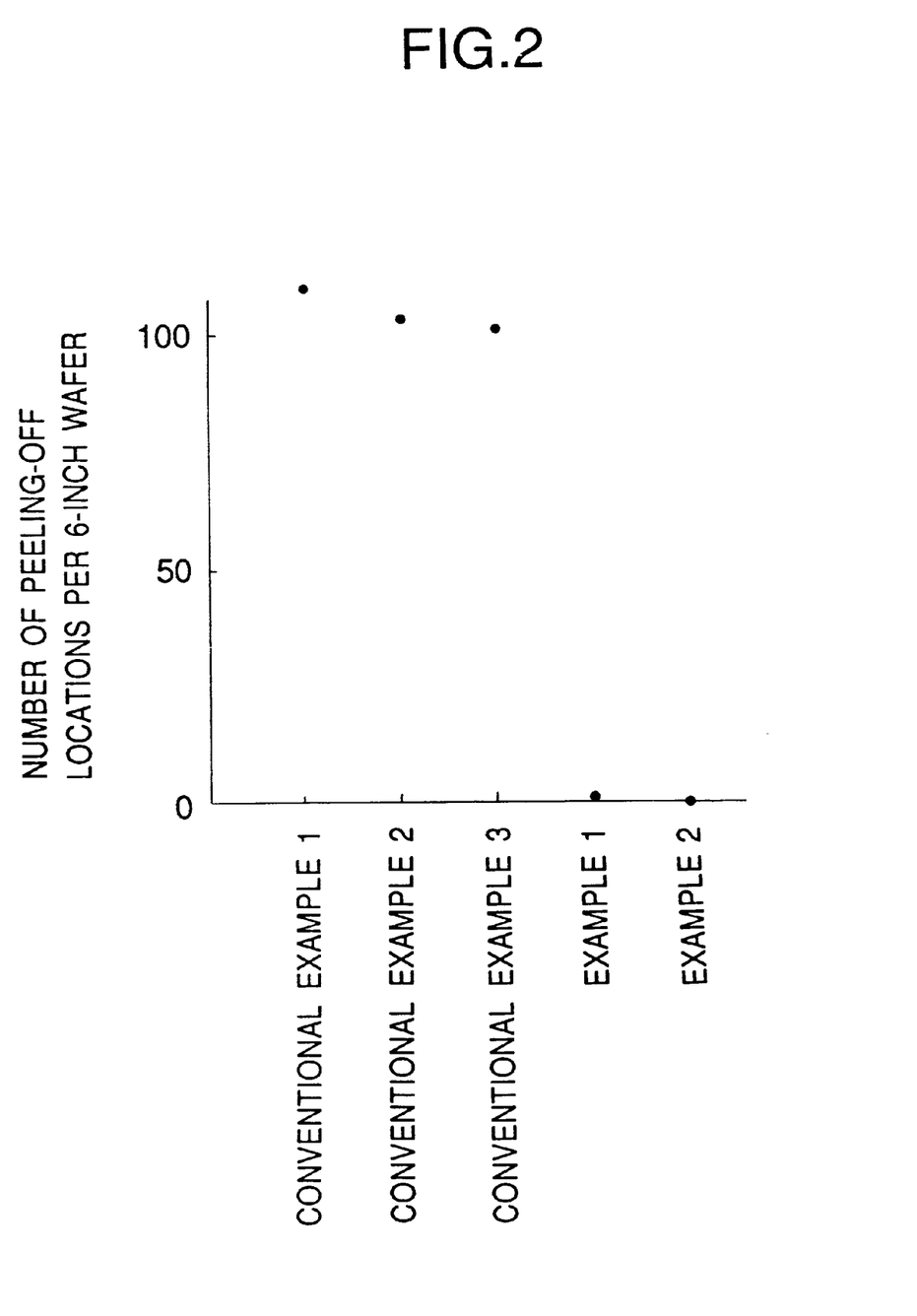
FIG. 2 is a graph showing numbers of peeling-off locations occuring on fluoride amorphous carbon on a wafer with respect to examples of this invention as compared with conventional examples.

Next, effects of the example 1 of the semiconductor device will be described with reference to FIG. 2. FIG. 2 shows numbers of peeling-off locations at which peeling-off events occur with respect to one wafer of 6 inch size, wherein, examples of this invention are compared with the conventional examples. FIG. 2 shows that the example 1 of this invention is clearly superior to the conventional examples.

In the conventional examples, numbers of peeling-off locations, at which peeling-off events occur on the fluoride amorphous carbon on the wafer, are more than "100". In contrast, the example 1 of this invention has almost zero peeling-off location.

Figure 3:
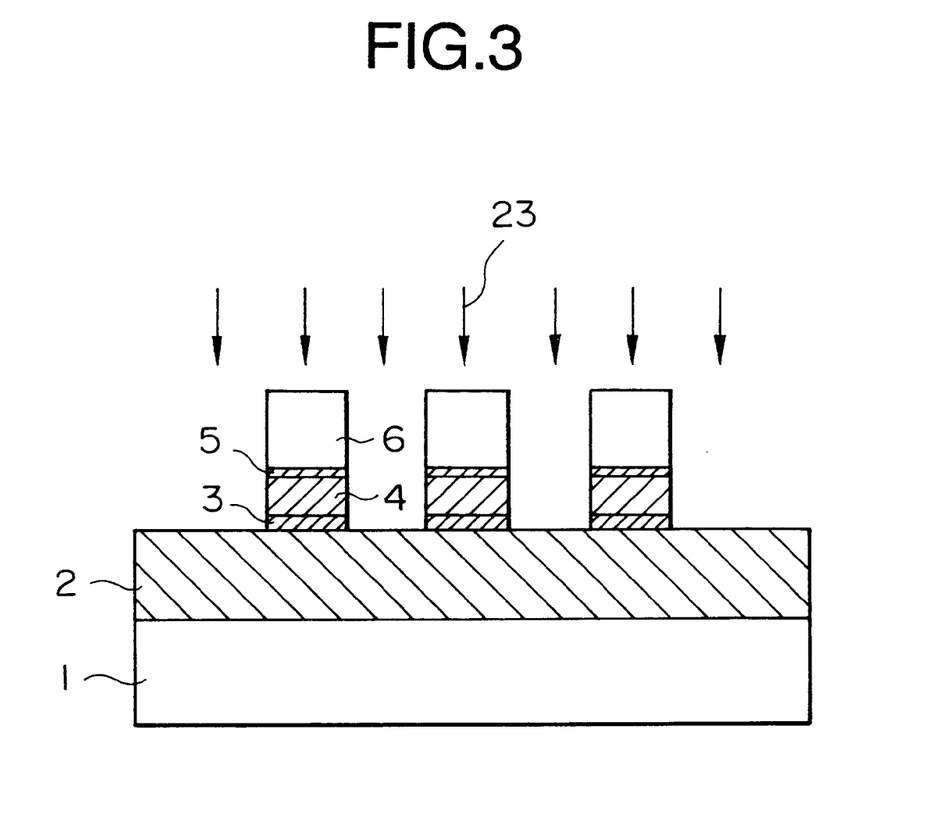
FIG. 3 is a sectional view showing a cross section of a semiconductor device which is manufactured in accordance with a manufacturing method according to example 2 of this invention.

Next, a description will be given with respect to an example 2 of this invention with reference to FIG. 3. FIG. 3 is a sectional view showing a cross section of a semiconductor device which is manufactured in accordance with a manufacturing method according to the example 2 of this invention. Specifically, the cross section shown in FIG. 3 corresponds to the aforementioned cross section shown in FIG. 1B which is a process sectional view of the semiconductor device manufactured in accordance with the manufacturing method according to the example 1 of this invention. The manufacturing method of the example 2 is roughly identical to that of the aforementioned example 1 except formation of a porous damage layer. For this reason, drawings for explaining the example 2 other than FIG. 3 are omitted.

In the example 2, a damage layer is formed on a surface of a first interlayer insulating film 2 by implantation of Si ions 23. Herein, the implantation of the Si ions 23 is performed under the conditions where energy ranges from 20 keV to 100 keV while dose rate ranges from 1E16 $(=1\times10^{16})$ $cm^{-2}$ to 1E17 $(=1\times10^{17})$ $cm^{-2}$.

According to the above formation of the damage layer, it is possible to form the damage layer on the surface of the first interlayer insulating film 2 corresponding to the insulating film corresponding to the oxide films made of the BPSG and the like. In addition, it is possible to form a region containing a large amount of silicon on the surface of the first interlayer insulating film. This region is capable of being easily connected with the fluoride amorphous carbon 8. So, it is possible to further improve the adherence between films or layers of the semiconductor device.

As shown in FIG. 2, the example 2 has almost zero peeling-off location on the 6-inch wafer.

In short, the examples of this invention are designed such that after the etching of the aluminum wires, the surface of the oxide film, which is located beneath the aluminum wiring layer, is made porous.

Thus, this invention is capable of providing effects as follows:

It is possible to maintain the adherence between the fluoride amorphous carbon and the oxide film which is a lower layer. In addition, it is possible to reduce occurrence of the open-circuit defective and short-circuit defective which are caused by peeling-off events of the wires and interlayer films which are located above the fluoride amorphous carbon. Thus, it is possible to provide remarkable improvements in reliability and yield in manufacture of the semiconductor devices.

As this invention may be embodied in several forms without departing from the spirit of essential characteristics thereof, the present examples are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A manufacturing method of a semiconductor device comprising steps of:

selectively etching aluminum wires;

reforming a surface of an oxide film which is located beneath the aluminum wires; and forming an organic interlayer film.

2. A manufacturing method of the semiconductor device as defined in claim 1 wherein when reforming the surface of the oxide film, after the etching of the aluminum wires, plasma process is effected using gas containing $CF_4$.

3. A manufacturing method of the semiconductor device as defined in claim 1 wherein when reforming the surface of the oxide film, after the etching of the aluminum wires, ion implantation is performed with respect to silicon.

4. A manufacturing method of the semiconductor device as defined in claim 1 wherein the organic interlayer film is made of fluoride amorphous carbon.

5. A manufacturing method of a semiconductor device comprising steps of:

selectively etching a metal wiring layer formed on an insulating film on a semiconductor substrate;

reforming a surface of the insulating film which is exposed by the etching; and forming an organic interlayer film to cover the metal wiring layer and the insulating film.

6. A manufacturing method of the semiconductor device as defined in claim 5 wherein the metal wiring layer contains an aluminum wiring layer, while the organic interlayer film is made of fluoride amorphous carbon.

7. A manufacturing method of the semiconductor device as defined in claim 5 wherein reforming is performed on the surface of the insulating film by performing plasma process on the surface of the insulating film using gas containing $CF_4$ after the etching of the metal wiring layer or by performing ion implantation of silicon before formation of the organic interlayer film made of fluoride amorphous carbon.

8. A manufacturing method of a semiconductor device comprising the steps of:

forming an aluminum wiring layer on an insulating film on a semiconductor substrate;

using resist as a mask to perform dry etching of the aluminum wiring layer, wherein the resist is painted on the aluminum wiring layer and is formed to have a pattern;

using gas of $CF_4$ to form a damage layer on a surface of the insulating film which is exposed by the dry etching;

peeling off the resist; and forming a fluoride amorphous carbon film on an overall surface of the semiconductor device.

9. A manufacturing method of the semiconductor device as defined in claim 8 wherein after the dry etching of the aluminum wiring layer, ion implantation is performed with respect to silicon.

10. A manufacturing method of a semiconductor device comprising the steps of:

using photolithography process to perform patterning of photoresist painted on a first wiring layer made of aluminum, which is formed on an interlayer insulating film on a semiconductor substrate;

using etching gas to perform selective etching with respect to the first wiring layer;

reforming a surface of the interlayer insulating film which is exposed by the selective etching;

peeling off the photoresist using $O_2$ plasma;

forming a layer of fluoride amorphous carbon in accordance with a CVD method;

forming a VIA hole through the layer of fluoride amorphous carbon; and forming a second wiring layer made of aluminum in contact with the first wiring layer via the VIA hole.

11. A manufacturing method of the semiconductor device as defined in claim 10 wherein the reforming of the surface of the interlayer insulating film is achieved by plasma process which is performed using gas of $CF_4$ to form a porous damage layer on the surface of the interlayer insulating film which is exposed by the selective etching.

12. A manufacturing method of the semiconductor device as defined in claim 10 wherein the reforming of the surface of the interlayer insulating film is achieved by performing ion implantation of silicon so as to form a damage layer on the surface of the interlayer insulating film which is exposed by the selective etching.

13. A manufacturing method of the semiconductor device as defined in claim 10 wherein the interlayer insulating film is made of BPSG.

14. A manufacturing method of the semiconductor device as defined in claim 10 wherein the etching gas corresponds to mixed gas containing $Cl_2$ and $N_2$.

15. A manufacturing method of the semiconductor device as defined in claim 10 further comprising the steps of:

patterning the second wiring layer; and forming a cover film made of silicon nitride.

* * * * *